(12) United States Patent
Clark et al.

(10) Patent No.: US 7,361,455 B2
(45) Date of Patent: Apr. 22, 2008

(54) ANTI-REFLECTIVE COATINGS

(75) Inventors: Shan C. Clark, Forest Grove, OR (US); Ernisse S. Putna, Beaverton, OR (US); Robert P. Meagley, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 143 days.

(21) Appl. No.: 10/815,528

(22) Filed: Mar. 31, 2004

(65) Prior Publication Data

US 2005/0221218 A1  Oct. 6, 2005

(51) Int. Cl.
*G03F 7/36* (2006.01)

(52) U.S. Cl. .................... 430/314; 430/323; 430/324; 430/326; 430/510; 430/512; 438/636

(58) Field of Classification Search ............... 430/510, 430/512, 326, 314, 323, 324; 438/636
See application file for complete search history.

(56) References Cited

U.S. PATENT DOCUMENTS

| | | | |
|---|---|---|---|
| 5,741,626 A * | 4/1998 | Jain et al. .................. 430/314 |
| 5,795,708 A * | 8/1998 | Boutet ........................ 430/617 |
| 6,033,977 A * | 3/2000 | Gutsche et al. ............. 438/618 |
| 6,444,320 B1 * | 9/2002 | Takei et al. ................. 428/413 |
| 6,503,689 B2 * | 1/2003 | Zampini et al. ......... 430/270.1 |
| 2003/0146416 A1 * | 8/2003 | Takei et al. ................. 252/500 |
| 2004/0072420 A1 * | 4/2004 | Enomoto et al. ........... 438/636 |

* cited by examiner

*Primary Examiner*—John S. Chu
(74) *Attorney, Agent, or Firm*—Blakely, Sokoloff, Taylor & Zafman LLP

(57) ABSTRACT

Anti-reflective materials such as bottom anti-reflective coatings (BARC's) and sacrificial light absorbing materials (SLAM) may be made more effective at preventing coherent light or electron beam reflection from a substrate by including in the anti-reflective material an additive to alter the radiation beam path of the reflected light or electrons. The radiation beam path altering additive may be a reflective material or a refractive material. The inclusion of such a radiation beam bath altering additive may reduce line width roughness and increase critical dimension (CD) control of interconnect lines and vias.

3 Claims, 12 Drawing Sheets

ANTI-REFLECTIVE COATINGS

BACKGROUND OF THE INVENTION

1. Field of the Invention

The present invention relates to the field of photolithography to form integrated circuits and more particularly to the field of anti-reflective coatings used in photolithography.

2. Discussion of Related Art

Photolithography is used in the field of integrated circuit processing to form the patterns that will make up the features of an integrated circuit. A photoresist is employed as a sacrificial layer to transfer a pattern to the underlying substrate. This pattern may be used as a template for etching or implanting the substrate. Patterns are typically created in the photoresist by exposing the photoresist to radiation through a mask. The radiation may be visible light, extreme ultraviolet (EUV) light, or an electron beam (either projection or direct write). In the case of a "direct write" electron beam, a mask is not necessary because the features may be drawn directly into the photoresist. The substrate underlying the photoresist may be reflective, thereby causing light or electrons to reflect back into the photoresist and distort the pattern.

Anti-reflective coatings (ARC) are typically employed to reduce the amount of light reflected from reflective surfaces back into the photoresist. These anti-reflective coatings may be a top ARC formed over the photoresist, a bottom ARC (BARC) formed under the photoresist and above the reflective substrate, or a specialty multipurpose ARC such as a sacrificial light absorbing material (SLAM). There are different ways by which an ARC may prevent reflection of the radiation from the silicon wafer back into the photoresist. One way that an ARC may work is by causing destructive interference with the light reflected from the silicon wafer. This may be done by tuning the thickness of the ARC such that destructive interference will occur within the ARC, for example by making the thickness of the ARC equal to half of the wavelength of the light. Destructive interference in the ARC may also be accomplished by tuning the refractive index of the ARC. An ARC may alternatively be a purely absorbing ARC that has been formulated to include light absorbing pigments. These types of ARC materials do not absorb or interfere with all of the light that is reflected from the silicon wafer. As a result, standing waves may be formed within the ARC due to the sum of light reflections from the top and bottom ARC interfaces. Standing waves cause problems such as line narrowing and line roughness in a photoresist as illustrated in FIGS. 1a and 1b. FIG. 1a illustrates a top view of photoresist lines 100 over a BARC 110. The dotted lines represent the portions of the photoresist 100 that has been affected by standing waves. Standing waves may cause line narrowing 120 and line roughness 130. FIG. 1b is a side view of the same photoresist lines 100. Line narrowing and line roughness of the photoresist will later translate to the resist and ultimately to the material being etched. Of particular concern is the formation of narrow lines and rough lines in dielectric materials that are etched to form interconnects and vias. The line roughness may be significant enough to degrade critical dimension control of the interconnect lines and vias or other structures formed by photoresist processes. To address the loss of CD control, thicker ARC materials have been used. But as the dimensions of integrated circuits are scaled down the thicker ARC materials are not integrateable.

The ARC may also be in the form of a sacrificial light absorbing material (SLAM). SLAM is used in dual damascene and it has light absorbing properties like an ARC and has etching properties similar to those of the dielectric layer used in the particular dual damascene structure. In dual damascene, a first etched region (e.g. a via or a trench) within a dielectric material may be filled with SLAM. After the first etched region is filled with the SLAM, a second region is photopatterned and etched (e.g., a trench if the via is already formed or a via if the trench is already formed). The dielectric layers into which the dual damascene via and trench combinations are etched lie on top of various other layers that may be made of metal or other materials. Those layers have different optical properties. As a result, when light strikes the surface of such a substrate, it may be reflected back up into the SLAM. Most of the light is absorbed by the light absorbing dyes within the SLAM but some of it that is not absorbed may cause undercutting of the resist material and ultimately loss of critical dimension (CD) control of the interconnect lines and vias formed by dual damascene processes incorporating SLAM. The loss of CD control may have a significant effect on structures formed by these methods as integrated circuit technology is scaled down to the 45 nm node where line width roughness may be approximately 2-3 nm, or scaled down to even smaller dimensions.

DETAILED DESCRIPTION OF THE PRESENT INVENTION

Described herein are novel anti-reflective materials for use in photolithography and methods of using such materials. In the following description numerous specific details are set forth. One of ordinary skill in the art, however, will appreciate that these specific details are not necessary to practice embodiments of the invention. While certain exemplary embodiments of the invention are described and shown in the accompanying drawings, it is to be understood that such embodiments are merely illustrative and not restrictive of the current invention, and that this invention is not restricted to the specific constructions and arrangements shown and described because modifications may occur to those ordinarily skilled in the art. In other instances, well known semiconductor fabrication processes, techniques, materials, equipment, etc., have not been set forth in particular detail in order to not unnecessarily obscure embodiments of the present invention.

Anti-reflective materials such as bottom anti-reflective coatings (BARC's) and sacrificial light absorbing materials (SLAM) may be made more effective at preventing coherent light, partially coherent light, reflection or electron beam reflection from a substrate into a photoresist by including an additive to alter the radiation beam path of the reflected light or electrons in the anti-reflective material. The radiation beam path altering additive may be a reflective material or a refractive material. The inclusion of such a radiation beam path altering additive may reduce line width roughness and increase critical dimension (CD) control of interconnect lines and vias.

Figure 1A:
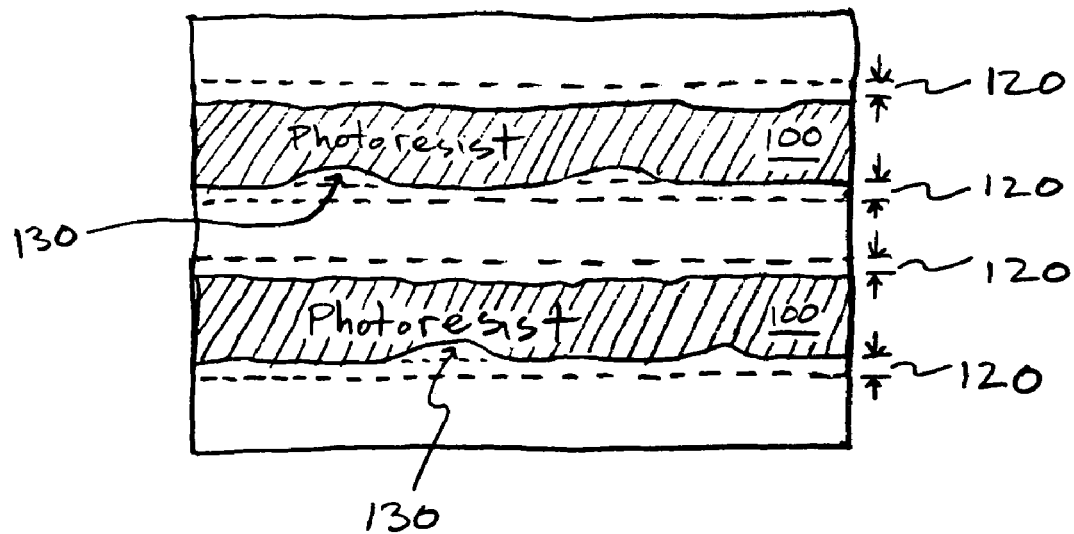
FIGS. 1a and 1b illustrate photoresists with the use of prior art anti-reflective coatings.
Figure 1B:
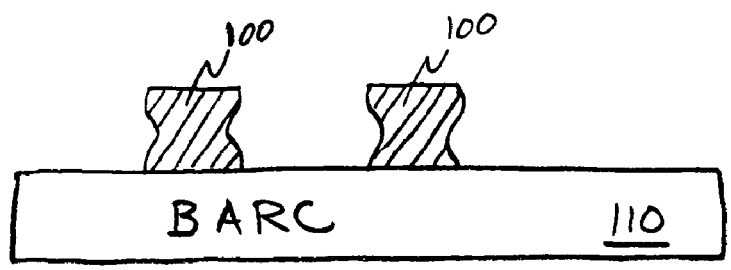
Figure 2A:
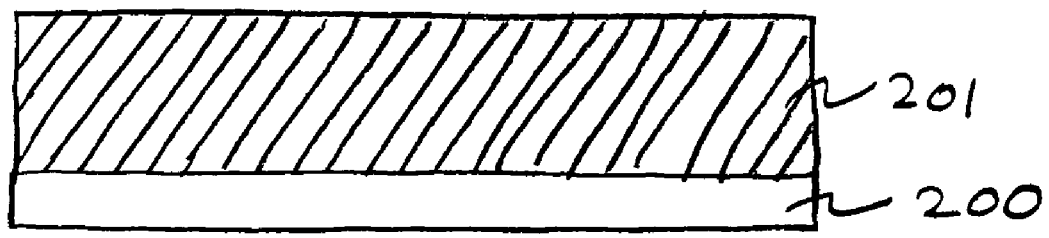
FIGS. 2a-2o illustrate cross-sectional views of a dual-damascene process of formig a via and an interconnect using a BARC and a sacrificial ARC according to embodiments of the invention.

Anti-reflective materials may be used in any semiconductor process where photoresists are used. In one embodiment, anti-reflective materials containing a light beam path altering additive may be used in a dual damascene process. In this exemplary dual damascene process, a trench is formed over a via. In an alternate embodiment, the dual damascene process may also be used to form a via over a trench. In FIG. 2a, first conductive layer 201 is formed on substrate 200. Substrate 200 may be any surface generated when making an integrated circuit upon which a conductive layer may be formed. In this particular embodiment the substrate 200 may be a semiconductor such as silicon, germanium, gallium arsenide or a semiconductor-on-insulator such as silicon-on-insulator.

Figure 2B:
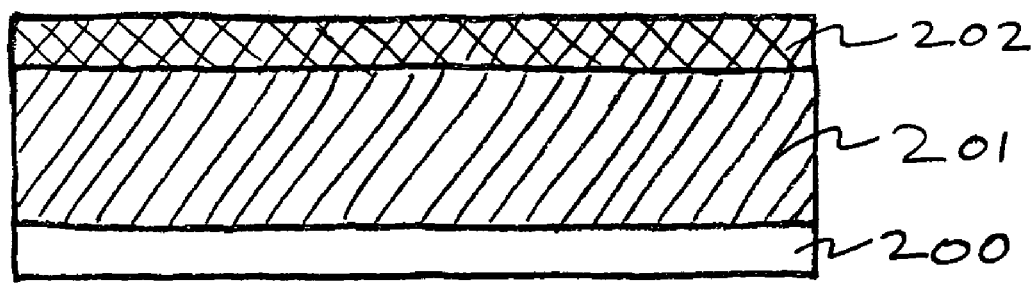
Figure 2C:
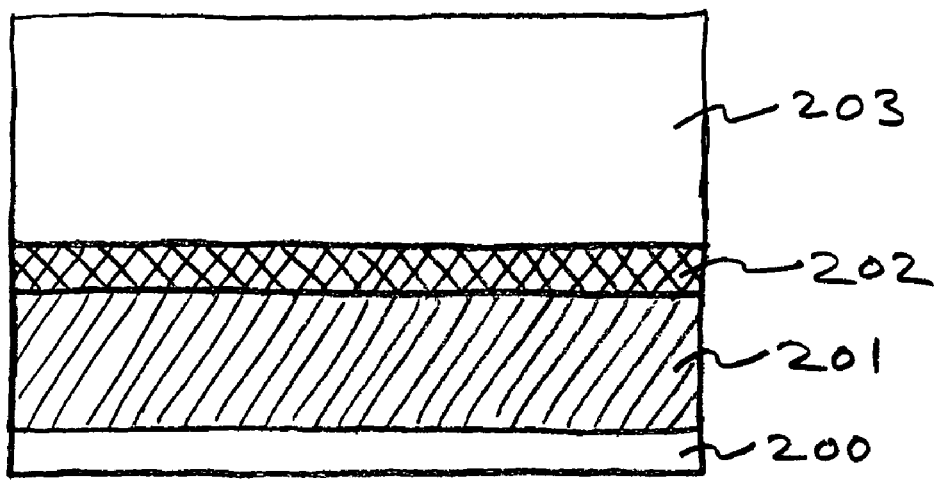

First conductive layer 201 may be made from materials conventionally used to form conductive layers for integrated circuits. For example, first conductive layer 201 may be made from copper, a copper alloy, aluminum or an aluminum alloy, such as an aluminum/copper alloy. First conductive layer 201 may be formed by electroplating, electroless deposition, chemical vapor deposition, or physical vapor deposition. The first conductive layer 201 may be formed on an underlying barrier layer or seed layer. In FIG. 2b, barrier layer 202 is formed on conductive layer 201. Barrier layer 202 will serve to prevent an unacceptable amount of copper, or other metal, from diffusing into dielectric layer 203, as illustrated in FIG. 2c, and causing shorts. Barrier layer 202 also acts as an etch stop to prevent subsequent via and trench etch stops from exposing first conductive layer 201 to subsequent cleaning steps. The barrier layer 202 may be formed of a material such as silicon nitride or oxynitride.

In FIG. 2c, the dielectric layer 203 is formed on top of barrier layer 202. Dielectric layer 203 may be an inorganic material such as silicon dioxide or carbon doped oxide (CDO) or a polymeric low dielectric constant material such as poly(norbornene) such as those sold under the tradename UNITY™, distributed by Promerus, LLC; polyarylene-based dielectrics such as those sold under the tradenames "SiLK™" and "GX-3™", distributed by Dow Chemical Corporation and Honeywell Corporation, respectively; and poly(aryl ether)-based materials such as that sold under the tradename "FLARE™", distributed by Honeywell Corporation. The dielectric layer 103 may have a thickness in the approximate range of 2,000 and 20,000 angstroms.

Figure 2D:
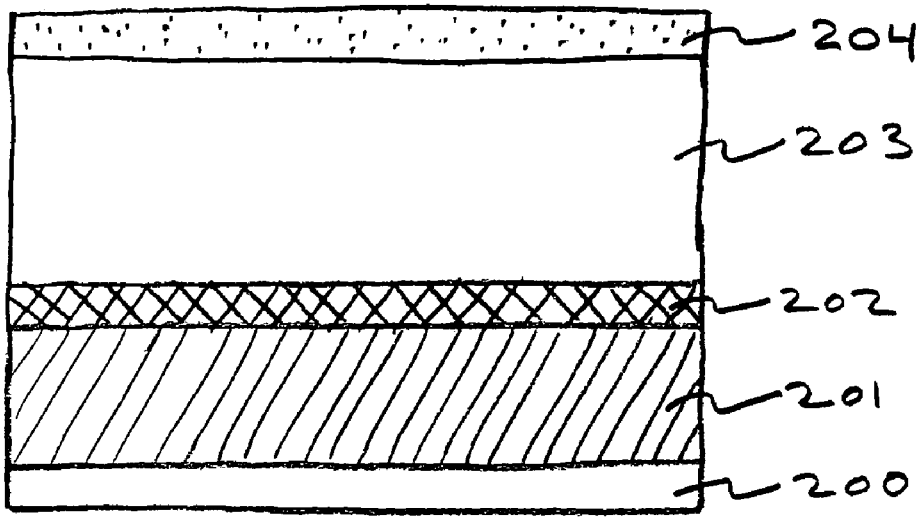
Figure 2E:
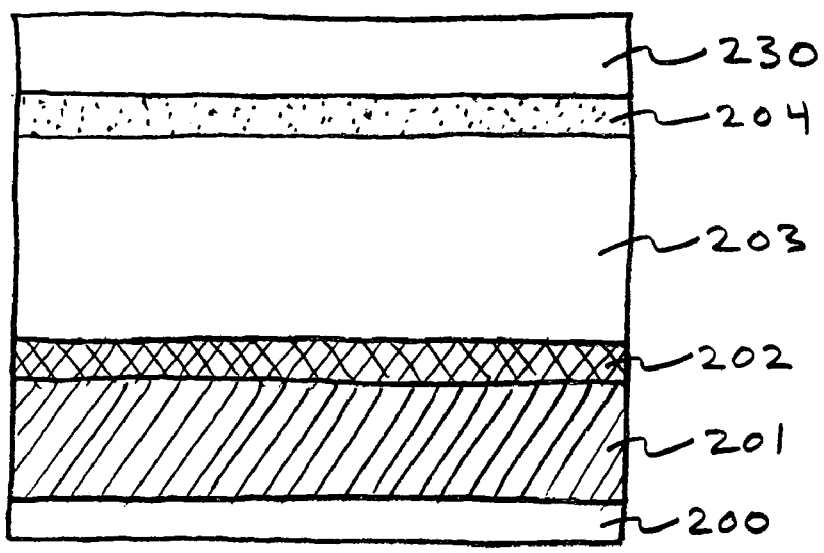

In FIG. 2d, after forming the dielectric layer 203, a bottom anti-reflective coating (BARC) 204 is formed. The BARC 204 is formed from an anti-reflective material that includes a radiation beam altering additive and will serve to minimize or eliminate any coherent light from re-entering the first photoresist 230, that is formed over the BARC 204 in FIG. 2e, during irradiation and patterning of the first photoresist 230. The radiation beam altering additive in the BARC 204 may scatter or refract any radiation that reflects off of the material underlying the BARC 204, such as a polished dielectric material ($SiO_2$), a polished hard mask ($SiO_2$ or SiON), a semiconductor material (polysilicon), or a metal. The BARC 204 is formed of a base material and a radiation beam altering additive. The base material may be an inorganic or organic material capable of being patterned by etching or by irradiation and developing, like a photoresist. In one particular embodiment, where the BARC 204 is an organic material, the BARC 204 base material is formed with an organic polymer such as poly(norborene), polystyrene, poly(p-phenylene), polyimide, and polyarylene, a wetting surfactant such as a functional alkoxysilane that helps the polymer spread out over the substrate, a photoacid generator, and a quencher in the form of a base. In this particular embodiment, the organic polymer is present in an amount in the approximate range of 70% and 95%, the additive that alters a radiation beam path is present in the approximate range of 0.1% and 10%, the wetting surfactant is present in an amount in the approximate range of 0.1% and 2%, the PAG is present in an amount sufficient to create the desired photospeed, and the quencher is present in the approximate range of 0.1% and 2%. The BARC 204 may also be formed of an inorganic base material such as $SiO_2$, SiN, and SiON.

Figure 3A:
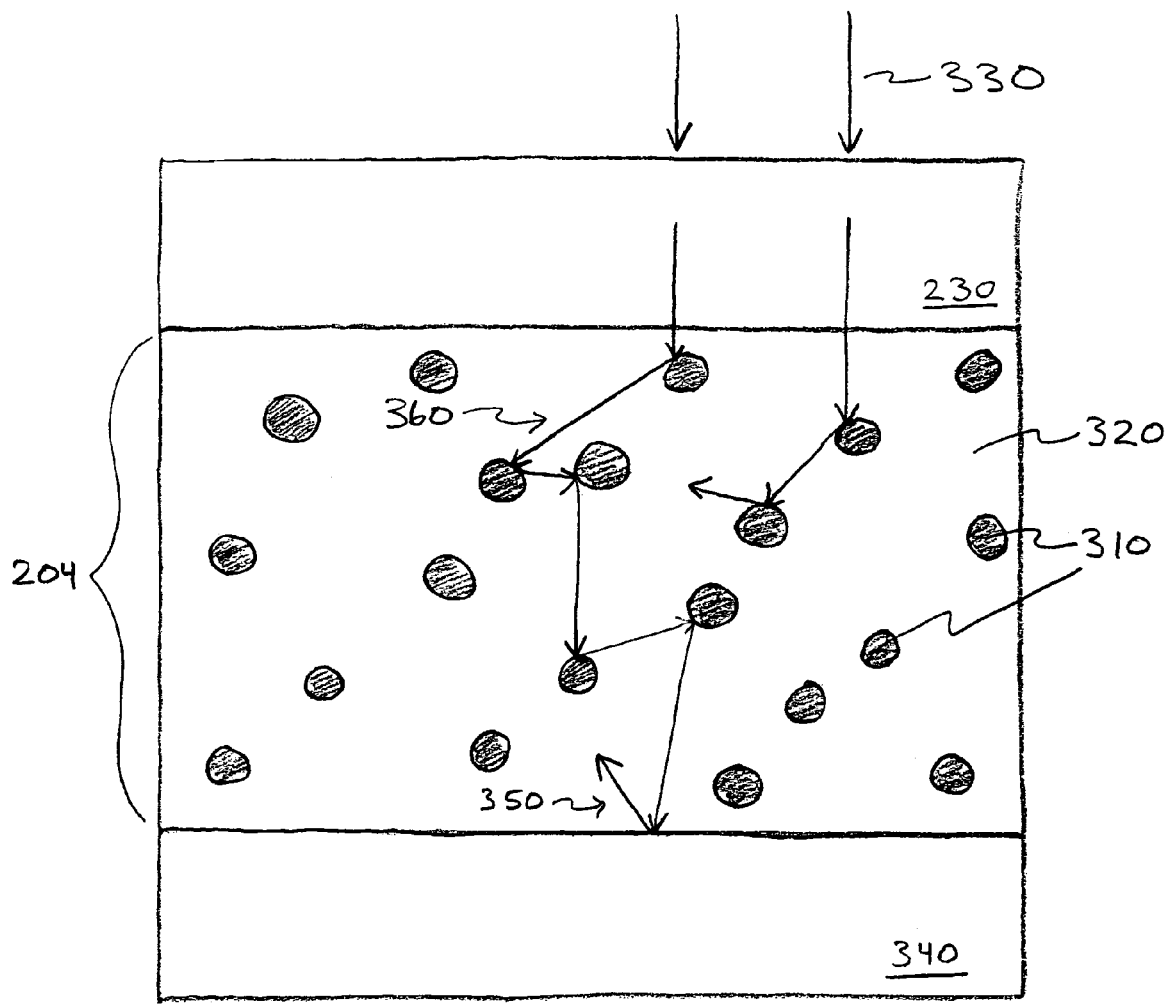
FIG. 3a is an illustration of a cross-sectional view of an anti-reflective coating containing a radiation beam path altering additive that is reflective.

The additive that alters a radiation beam path that is added to the BARC base material may be a reflective material, a refractive material, a reflective and refractive material, a refractive and absorbent material, or any combination of these additives. The reflective material may be selected based on the type of radiation being used so that it maximizes the scattering within the BARC 204. In one embodiment, the additive may be a reflective material in the form of a pigment. A BARC 204 containing a reflective pigment is illustrated in FIG. 3a. The reflective particles 310 contained within the BARC base material 320 may reflect incoming radiation 330 as the radiation enters and progresses through the BARC 204, radiation reflected from a reflective substrate 340, as illustrated at 350, and radiation reflected from other pigment particles as illustrated at 360. The incoming radiation 330 may be ultraviolet, extreme ultraviolet, x-ray, electron projection, or electron beam "direct write". Particular wavelengths of light that may be used include 365 nm, 248 nm, 193 nm, 157 nm, and 13.5 nm. By scattering the radiation within the BARC 204 in this manner, the likelihood that enough coherent reflected light would reenter the first photoresist 230 to cause standing waves is reduced or eliminated.

The reflective particles 310 may be sufficiently large to reduce the amount of coherent light reflected out of the BARC 204 and into the photoresist 230 to prevent standing waves. The reflective particles 310 may also large enough to create individual reflections that may present a resolveable image in the photoresist 230. Therefore, the reflective particles may have a size in the approximate range of 1/10 lambda and 1/2 lambda. The approximate minimum and maximum particle sizes for particular examples of wavelengths of light used to expose photoresists are listed below in Table 1:

TABLE 1

| Wavelength (nanometers) | Approx. Minimum Particle Size (nanometers) | Approx. Maximum Particle Size (nanometers) |
|---|---|---|
| 365 nm | 37 | 183 |
| 248 nm | 25 | 124 |
| 193 nm | 19 | 97 |
| 157 nm | 16 | 78 |
| EUV 13.5 nm | 1 | 7 |

The reflective additive added to an inorganic BARC 204 may be a material such as zinc oxide, silica, titanium dioxide, carbonates (such as calcium carbonate and zinc carbonate), diatomaceous earth, barium sulfate, inorganic modified inorganic particles (for example titanium doped silicon), or zirconia. Titanium dioxide has the benefit of also being environmentally safe. The reflective additive is selected based on the type of radiation being used so that it maximizes the scattering within the sacrificial ARC.

Figure 3B:
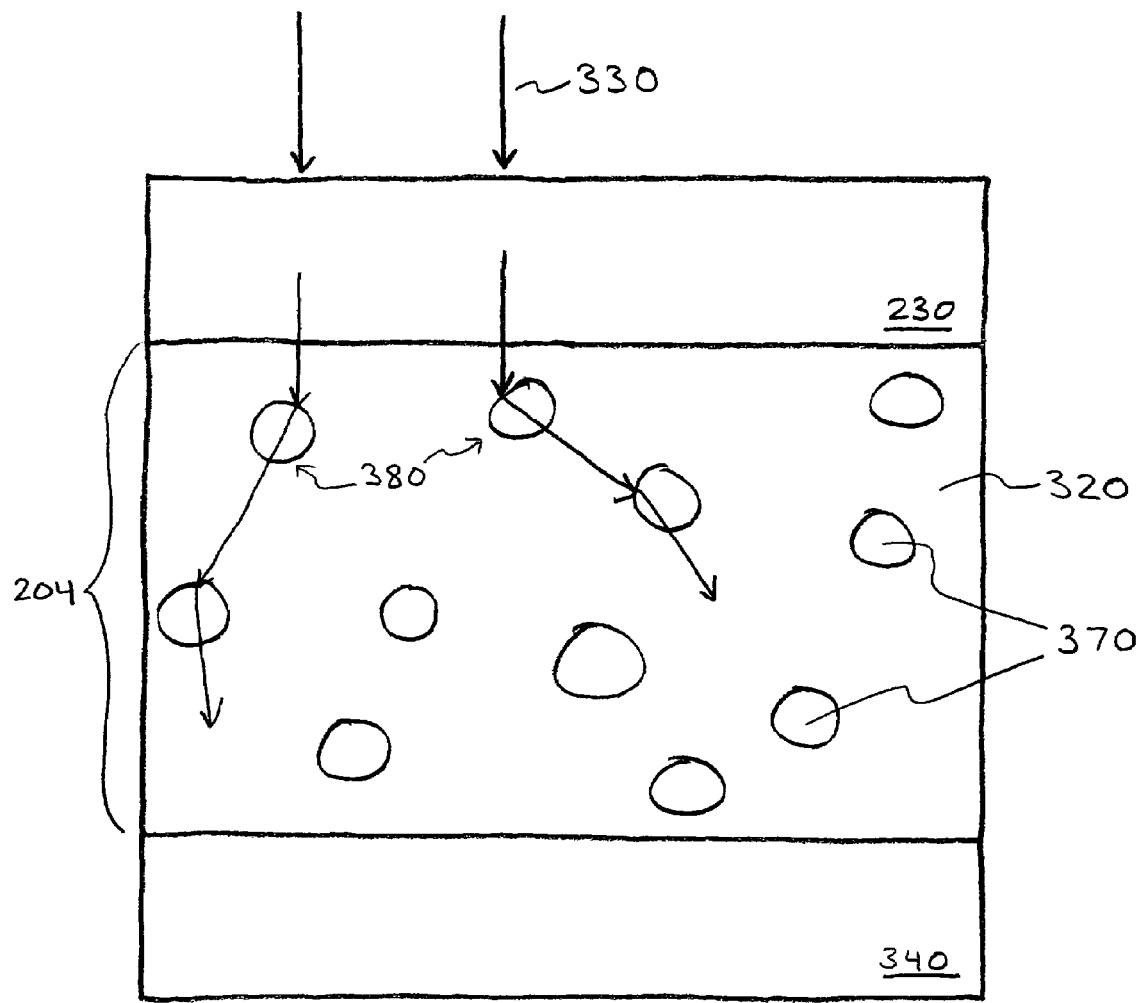
FIG. 3b is an illustration of a cross-sectional view of an anti-reflective coating containing a radiation beam path altering additive that is refractive.

In an alternate embodiment, illustrated in FIG. 3b, the radiation beam altering additive may be a refractive additive 370. The refractive additive 370 may be organic or inorganic polymer beads that are tailored by refractive index to refract the particular radiation exposed to the photoresist. In one embodiment the polymer beads may be formed of polymers such as polystyrene, polymethacrylate, and polymethylmethacrylate. The refractive additive 370 may be added to organic or inorganic BARC 204 materials. The refractive additive 370 may be tailored to maximize the mismatch in the refractive indices for the BARC base material 320 with respect to the refractive additive 370. As the incident radiation 330 enters the BARC 204 after passing through the photoresist 230, it may be refracted by the refractive additives 370 as illustrated at 380. Depending on the refractive index of the refractive additive 370, the incoming light 330 that hits a refractive additive 370 will be bent according to Snell's law. Refracting the incoming light 330 within the BARC 204 may minimize or eliminate enough reflection of the incoming radiation 330 from the reflective substrate 340 to minimize or eliminate coherent radiation from reentering the photoresist and causing line roughness and loss in CD control due to standing waves.

Figure 3C:
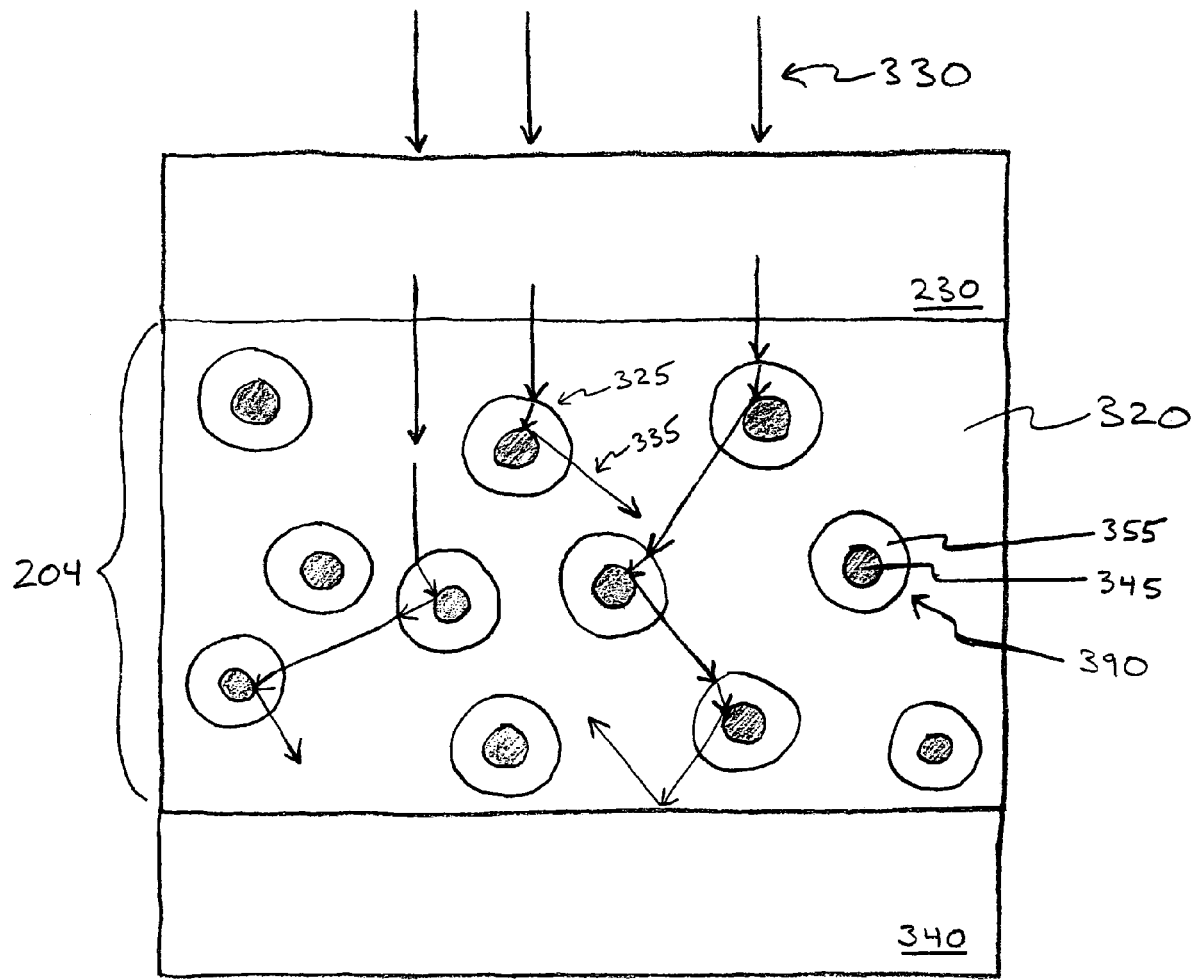
FIG. 3c is an illustration of a cross-sectional view of an anti-reflective coating containing a radiation beam path altering additive having a core-shell structure that is reflective and refractive.

In another embodiment, the additive to alter a radiation beam path may have dual properties due to a core-shell structure as illustrated in FIG. 3c. The core-shell particles 390 may have a core 345 and a shell 355 that have different properties to alter a radiation beam path. The core-shell structure of the particles 390 allows the additives to be both reflective and refractive, absorbent and refractive, or where the core 345 and the shell 355 have different refractive indices with respect to one another. In one embodiment, illustrated in FIG. 3c, where the core-shell particle 390 is both reflective and refractive, the core 345 is a reflective material and the shell 355 is a refractive material. The shell 355 may be a solid polymer material that refracts the light used to irradiate the photoresist and the core 345 may be any of the reflective materials listed above such as titanium, silica, or calcium carbonate. As incident light 330 enters the BARC 204, the light may be bent by refraction in the shell 355, as illustrated at 325, into the reflective core 345. Light that is refracted into the reflective core may be reflected back out of the core-shell particle, as illustrated at 335, and refracted yet again as it exits the particle. In this way, the core-shell structure maximizes the scattering of light within the BARC 204 material to prevent any coherent light from reflecting back into the photoresist 230 with enough intensity to create standing waves. In an alternate embodiment, the core-shell structure may be a refractive shell containing an absorbent core. The refractive shell may serve to refract radiation into the absorbent core or into another core-shell particle. The shell may be a solid polymer material that is refractive of the light used to irradiate the photoresist and the absorbent core may be any pigment that is absorbent to the wavelength used to irradiate the photoresist. For example, the absorbent pigment may be anthracene, naphthalene, benzophenone, phthalamide, or isopropylthioxanthanone.

When the core-shell structure is used as the radiation path altering additive, EUV poses a particular challenge because EUV radiation is sufficiently energetic to induce inner shell excitation in constituent atoms leading to absorption and emission of electrons (ionization). To accommodate EUV reflection, multilayer mirrors may be used. Multilayer mirrors are alternating layers of materials that boost reflectivity by causing the light reflected at each interface between the materials to constructively interfere with light reflected from other interfaces between the materials. Examples of multilayer mirror materials include alternating layers of tungsten and carbon, molybdenum and silicon, and molybdenum and beryllium. Multilayer mirror particles may have approximately 30 to 100 alternating layers of materials. In one particular embodiment the multilayer mirror particles may be alternating layers of molybdenum and silicon and may reflect greater than 60% of EUV light having a 13.5 nm wavelength.

The BARC 204 may also contain surfactants to sterically or electrostatically separate the additives from one another. It may be valuable to separate the additives from one another to prevent dependent scattering effects and to increase relative reflectance values. The surfactants may be added to the formulation of the sacrificial ARC material. Examples of surfactants include ethylene glycol-propylene glycol copolymers, polylactones, and polylactams.

In an alternate embodiment, the BARC 204 may also contain organic or inorganic dyes that absorb light in addition to the additive that alters a radiation beam path. The organic or inorganic material chosen for the dye preferably should absorb light that is used during the exposure step of the photolithographic process. The quantity and type of light absorbing dye should enable absorption of light having a wavelength identical to that used to expose the photoresist. In one embodiment, the dye is a distinct molecule added to the BARC 204. In another embodiment the dye is a "contained" dye that is an additional side group functionality added to the BARC polymer. Examples of "contained" dyes include anthracene, naphthalene, benzophenone, phthalamide, or isopropylthioxanthanone.

Figure 2F:
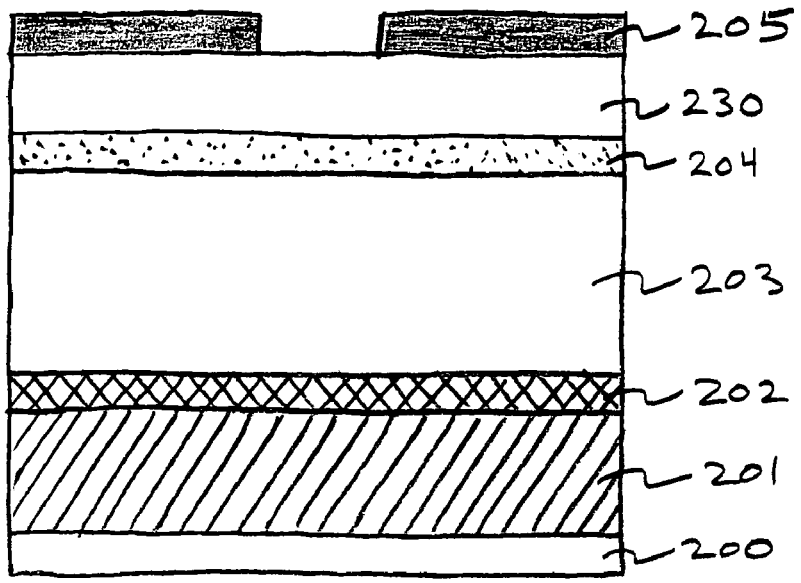

As illustrated in FIG. 2f, the first photoresist layer 230 is patterned by irradiation on top of the BARC 204 by mask 205 to define a via formation region for receiving a subsequently formed conductive layer that will contact first conductive layer 201. First photoresist layer 230 may be patterned using conventional photolithographic techniques, such as masking the layer of photoresist, exposing the masked layer to radiation, then developing the unexposed portions. The radiation may be light having a wavelength of 365 nm, 248 nm, 193 nm, 157 nm, deep ultraviolet (DUV), or extreme ultraviolet (EUV) such as 13.5 nm. The radiation may also be electron beam projection, electron beam scalpel, and ion beam lithographic technologies.

Figure 2G:
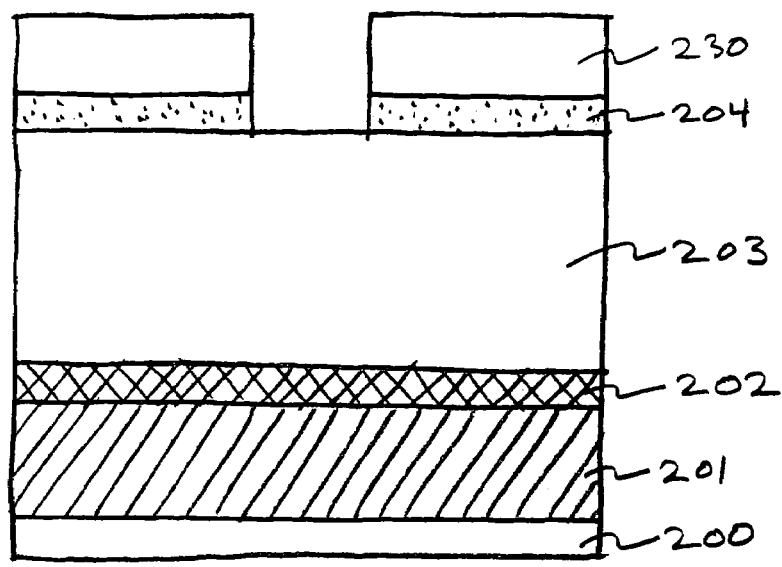

The resulting structure is illustrated in FIG. 2g. Although this particular embodiment does not specify forming a hard mask on top of the dielectric layer 203 prior to applying the first photoresist 230, such a hard mask may be valuable when using certain types of material to form dielectric layer 203, such as low-k polymer materials.

Figure 2H:
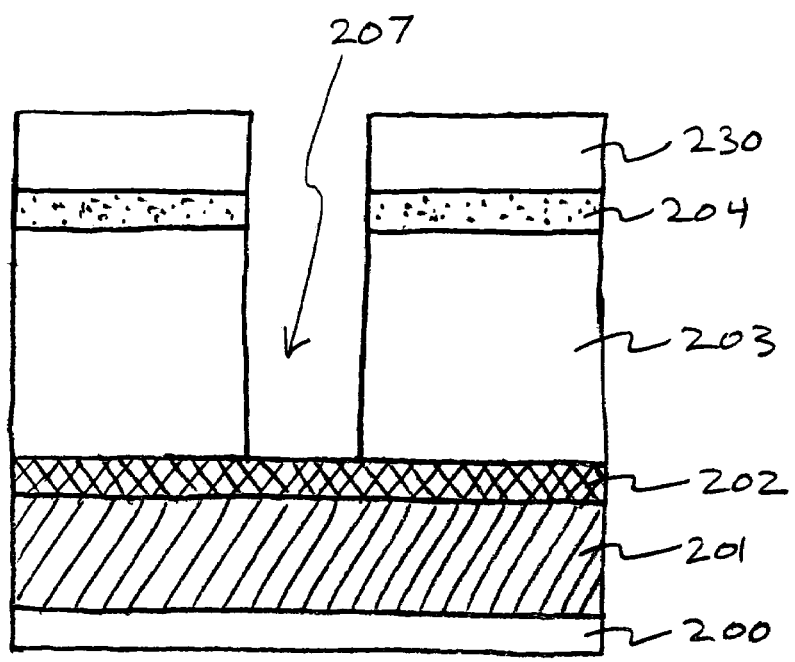

After first photoresist 230 is patterned, via 207 is etched through dielectric layer 203 down to barrier layer 202, as illustrated in FIG. 2h. Conventional process steps for etching through a dielectric layer may be used to etch the via, e.g., a conventional anisotropic dry oxide etch process. When silicon dioxide is used to form dielectric layer 203, the via may be etched using a medium density magnetically enhanced reactive ion etching system ("MERIE" system) using fluorocarbon chemistry. When a polymer is used to form dielectric layer 203, a forming gas chemistry, e.g., one including nitrogen and either hydrogen or oxygen, may be used to etch the polymer.

Figure 2I:
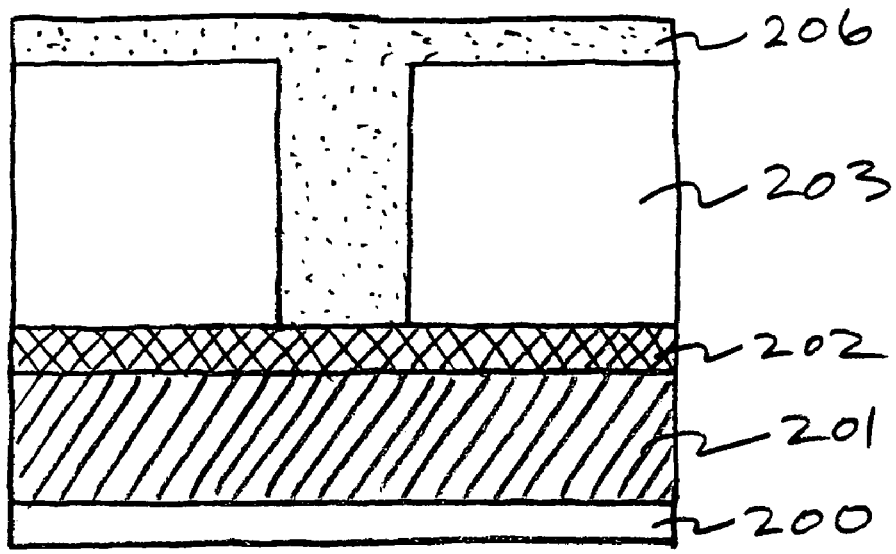

After via 207 is formed through dielectric layer 203, the first photoresist 230 and the BARC 204 are removed. Photoresist 230 and BARC 204 may be removed using a conventional ashing procedure. Via 207 is then filled with a sacrificial ARC material 206 that contains an additive to alter a radiation beam path, generating the structure illustrated in FIG. 2i. The sacrificial ARC 206 containing a radiation beam altering additive or additives may be deposited by spin coating to a thickness in the approximate range of 500 and 5000 angstroms. The sacrificial ARC 206 is formulated to have etch properties similar to those of dielectric layer 203. In an embodiment where the dielectric layer 203 is an inorganic material such as silicon dioxide or CDO, the base material of the sacrificial ARC 206 may be a spin-on-glass (SOG) such as DUO™ that is manufactured by Honeywell Corporation. In an embodiment where the dielectric layer 203 is a low-k polymer material, the base material of the sacrificial ARC material 206 may be a spin-on-polymer (SOP) that has a polymeric backbone similar to that of the dielectric layer 203. For example, the polyermeric backbone of the SOP may be poly(norbornene), polystyrene, poly(p-phenylene), polyxylene, polyimide, and polyarylene.

The additive that alters a radiation beam path that is added to the sacrificial ARC 206 base material may be a reflective material, a refractive material, a reflective and refractive material, a refractive and absorbent material, or any combination of these additives. The additive to alter a radiation beam path is added to the sacrificial ARC 206 in an amount sufficient to prevent coherent light from reflecting back into the first photoresist 230. Any of the radiation beam path altering additives described above for use in the BARC 204 may be used in the sacrificial ARC 206. In one embodiment, the additive may be a reflective material in the form of a pigment that is added to the sacrificial ARC material formulation. In embodiments where the sacrificial ARC material is inorganic, and in particular a silicon based inorganic such as silicon dioxide and CDO, the pigment may be a reflective additive such as zinc oxide, silica, titanium dioxide, carbonates (such as calcium carbonate and zinc carbonate), diatomaceous earth, barium sulfate, inorganic modified inorganic particles (for example titanium doped silicon), or zirconia. Titanium dioxide has the benefit of also being environmentally safe. The reflective additive is selected based on the type of radiation being used so that it maximizes the scattering within the sacrificial ARC 206. The reflective particles must be sufficiently large to reduce the amount of light reflected out of the sacrificial ARC 206 and into the photoresist to prevent standing waves, but not so large as to create individual reflections that may present a resolveable image in the photoresist. Therefore, the reflective particles may have a size in the approximate range of ¹⁄₁₀ lambda and ½ lambda. Table 1 above gives examples wavelengths of radiation and the approximate minimum and maximum particle sizes for particular wavelengths of light used to expose photoresists.

In another embodiment the additive to the sacrificial ARC 206 may be a refractive material that will bend light according to Snell's law. In this embodiment, the refractive material tailored to maximize the mismatch in the refractive indices for the sacrificial ARC with respect to the refractive additive. The refractive additive may be hollow organic or inorganic shells or polymer beads that are tailored to refract the particular radiation exposed to the photoresist. Alternatively, the refractive additive may have a core-shell structure such as the one illustrated in FIG. 3c where the core and the shell have different refractive indices with respect to one another. The choice of an inorganic or organic material depends on what type of base material is used for the sacrificial ARC. If the sacrificial ARC 206 is inorganic, then the refractive material may be inorganic so that is soluble in the sacrificial ARC 206. If the sacrificial ARC 206 is organic, then the refractive material may be organic so that it is soluble in the sacrificial ARC 206.

In another embodiment, the additive to the sacrificial ARC 206 may have dual properties due to a core-shell structure. Additives having a core-shell structure are illustrated in FIG. 3c. The core-shell structure allows the additives to be both reflective and refractive or absorbent and refractive. In one embodiment, where the core-shell particle 390 is both reflective and refractive, the core 345 is a reflective material and the shell is a refractive material. For example, the shell may be a solid polymer material that is refractive of the light used to irradiate the photoresist and the core may be any of the reflective materials listed above such as titanium, silica, or calcium carbonate. The core-shell structure maximizes the scattering of light within the sacrificial ARC 206 to prevent any coherent light from reflecting back into the photoresist with enough intensity to create standing waves. In an alternate embodiment, the core-shell structure may be a refractive shell containing an absorbent core. The refractive shell may serve to refract radiation into the absorbent core or into another core-shell particle. The shell may be a solid or hollow polymer material that is refractive of the light used to irradiate the photoresist and the absorbent core may be any pigment that is absorbent to the wavelength used to irradiate the photoresist. For example, the absorbent pigment may be anthracene, naphthalene, benzophenone, phthalamide, or isopropylthioxanthanone. When the core-shell structure is used as the radiation path altering additive, EUV poses a particular challenge because EUV radiation is sufficiently energetic to induce inner shell excitation in constituent atoms leading to absorption and emission of electrons (ionization). To accommodate EUV reflection, multilayer mirrors are used. Multilayer mirrors are alternating layers of materials that boost reflectivity by causing the light reflected at each interface between the materials to constructively interfere with light reflected from other interfaces between the materials. Examples of multilayer mirror materials include alternating layers of tungsten and carbon, molybdenum and silicon, and molybdenum and beryllium. Multilayer mirror particles may have approximately 30 to 100 alternating layers of materials. In one particular embodiment the multilayer mirror particles may be alternating layers of molybdenum and silicon and may reflect greater than 60% of EUV light having a 13.5 nm wavelength.

The sacrificial ARC 206 containing an additive to alter a light beam path may also contain surfactants to sterically or electrostatically separate the additives from one another. It may be valuable to separate the additives from one another to prevent dependent scattering effects and to increase relative reflectance values. The surfactants may be added to the formulation of the sacrificial ARC material. Examples of surfactants include ethylene glycol-propylene glycol copolymers, or polylactones, polylactams.

In an alternate embodiment, the sacrificial ARC 206 may also contain organic or inorganic dyes that will absorb light in addition to the additive that alters a radiation beam path. The organic or inorganic material chosen for the dye preferrably should absorb light that is used during the exposure step of the photolithographic process. The quantity and type of light absorbing dye should enable absorption of light having a wavelength identical to that used to expose the photoresist to pattern it. For example, the dye may be selected to absorb light having a wavelength identical to that used to expose the photoresist to pattern it.

Figure 2J:
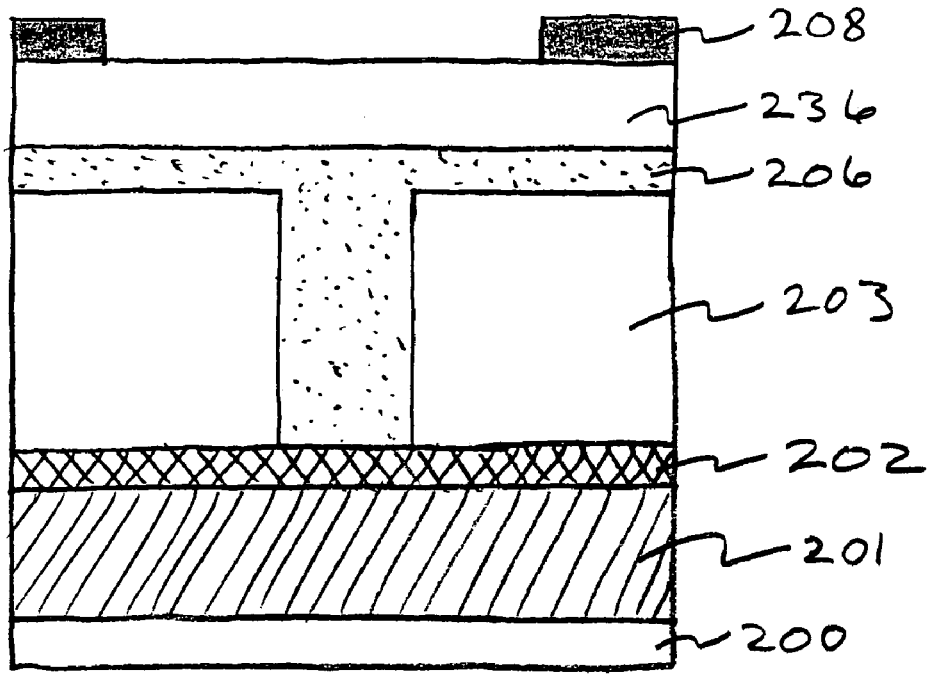

After filling via 207 with sacrificial ARC material 206, as illustrated in FIG. 2j, second photoresist layer 236 is applied on top of the sacrificial ARC 206, then patterned with mask 208 to define a trench formation region. Second photoresist layer 236 may be patterned using conventional photolithographic techniques. The radiation may be light having a wavelength of 365 nm, 248 nm, 193 nm, 157 nm, deep ultraviolet (DUV), or extreme ultraviolet (EUV) such as 13.5 nm. The radiation may also be electron beam projection, electron beam scalpel, and ion beam lithographic technologies. The radiation beam altering additive included in the sacrificial ARC 206 improves the line roughness and CD control of the trench 210 formed by the photolithographic process described above by reducing the amount of coherent light reflected from the substrate back up into the photoresist 236. Better CD control may enable use of integrated circuit dimensions, such as in the 45 nm node and beyond, to make integrated circuits with dual damascene structures.

Figure 2K:
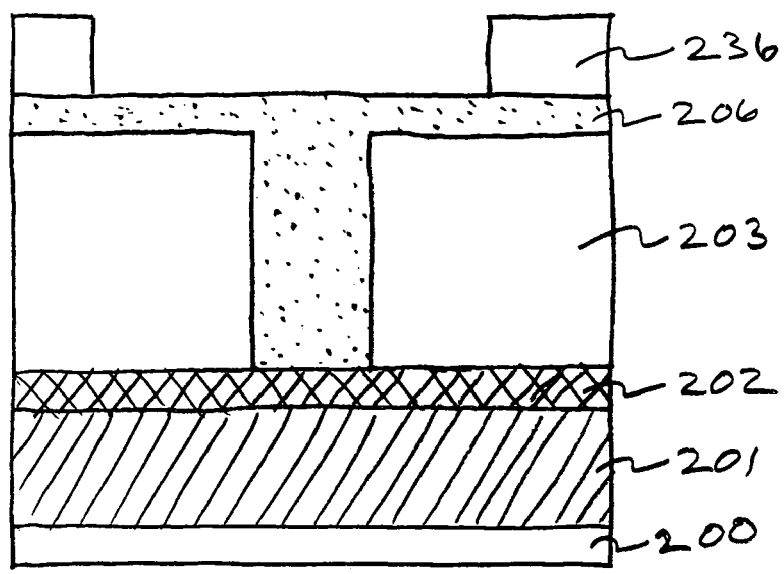
Figure 2L:
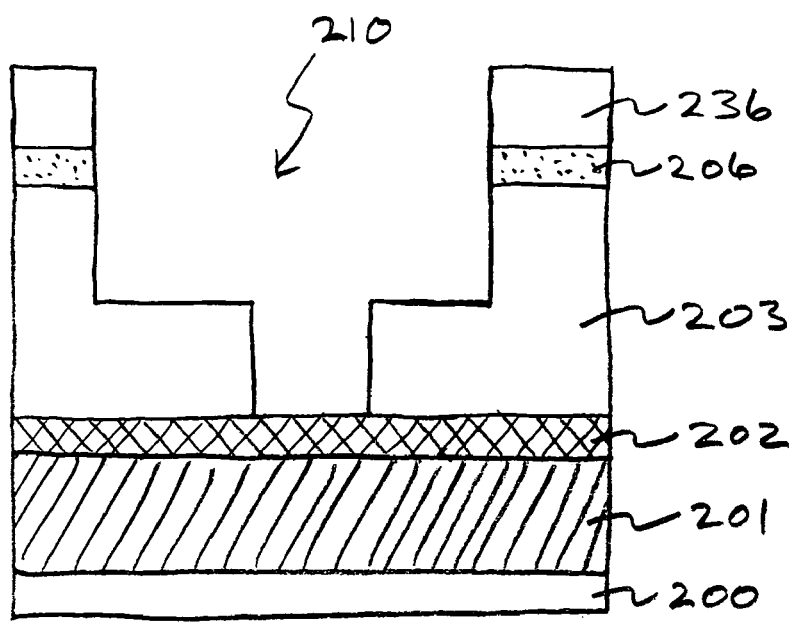

The patterned second photoresist 236, after removal of the mask 208, is illustrated in FIG. 2k. Following the photoresist patterning step, trench 210 is etched into dielectric layer 203 to form the structure illustrated in FIG. 2l. The etching process is applied for a time sufficient to form a trench having the desired depth. The etch chemistry chosen to etch trench 210 preferably should remove sacrificial ARC material 206 at a slightly faster rate than it removes dielectric layer 203, to avoid formation of defects. Trench 210 may be etched using the same equipment and etch chemistry that had been used previously to etch via 207. As with the via etch step, barrier layer 202 may act as an etch stop during the trench etching process, protecting the underlying conductive layer 201 from the etch step, and any subsequent ashing or cleaning steps. In addition, the presence of any portion of sacrificial ARC material 206 that remains at the bottom of via 207 after the trench etch step may help ensure that first conductive layer 201 will not be affected by the trench etch process.

By filling via 207 with a sacrificial ARC 206 having dry etch characteristics like those of dielectric layer 203, the trench lithography process effectively applies to a substantially "hole-free" surface, similar to one without via 207. By selecting an appropriate SOP or SOG material for sacrificial ARC 206, and an appropriate etch chemistry, trench 210 may be etched into dielectric layer 203 at a rate that is almost as fast as sacrificial ARC 206 is removed. Such a process protects the underlying barrier layer 202 during the etching of the trench 210. Such a process thus permits the use of a trench etch chemistry that produces superior trench and via profiles without having to consider the effect such etch chemistry has on the selectivity between dielectric layer 203 and barrier layer 202.

Figure 2M:
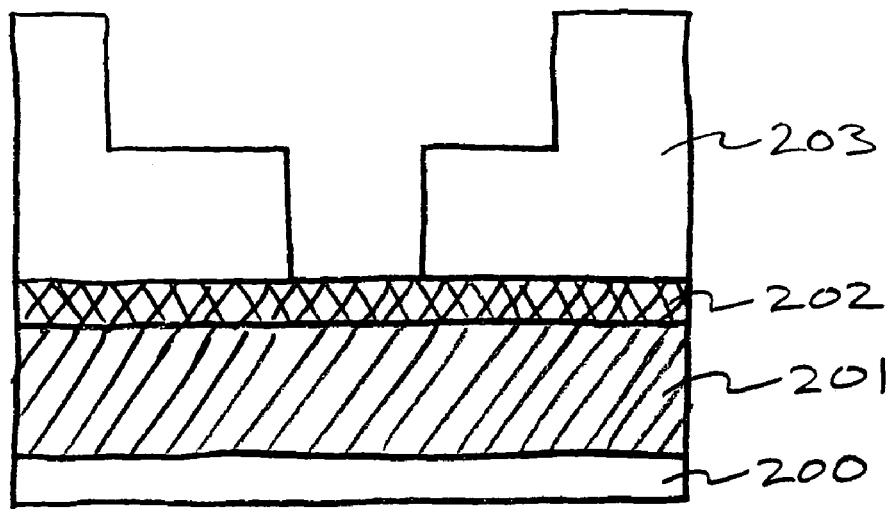

After trench 210 is etched, cleaning steps follow to remove second photoresist 236 and residues that may remain on the device's surface and inside the via 207, as illustrated in FIG. 2m. Second photoresist 236 may be removed using a conventional ashing step. Following such an ashing step, to ensure removal of remaining portions of sacrificial ARC 206, a wet etch step having a significantly higher selectivity for sacrificial ARC 206 over dielectric layer 203 should be used. When dielectric layer 203 comprises silicon dioxide and sacrificial ARC 206 comprises SOG, a 50:1 buffered oxide etch process should ensure that the remaining SOG material is removed at a substantially faster rate than the silicon dioxide. Alternatively, depending upon the type of SOG or SOP, and the dielectric material used, other wet etch chemistry may be used, e.g., chemistry based on commercially available amine based or amine-free materials. Irrespective of the chemistry chosen for the wet etch, there is high selectivity between the sacrificial ARC 206 and the dielectric layer 203.

Barrier layer 202 protects conductive layer 201 from exposure to the solvents and/or oxidizing environment used when cleaning the trench 210. After the cleaning of the trench 210, the portion of the barrier layer 202 that separates via 207 from conductive layer 201 is removed to expose conductive layer 101. An etchant chemistry that is selective to the dielectric 203 is preferably used to remove the portion of barrier layer 202, as is well understood by those skilled in the art.

Figure 2N:
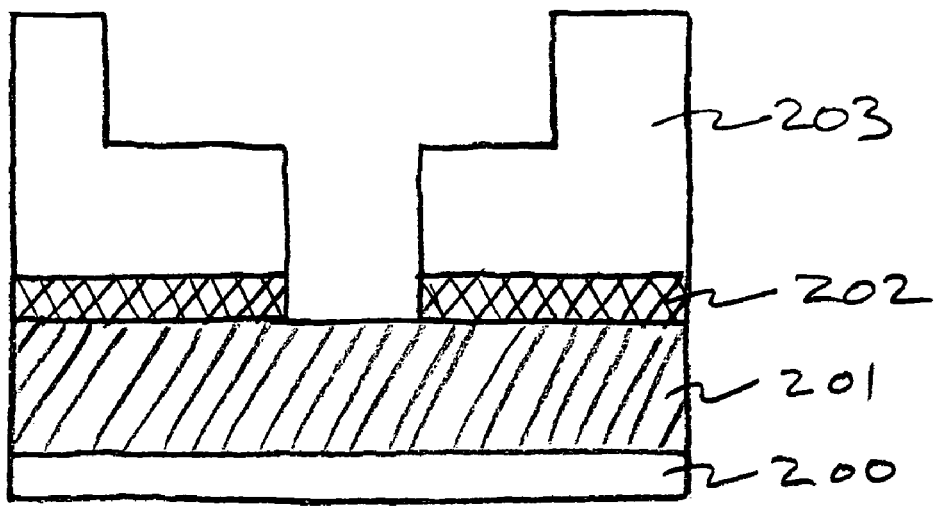
Figure 20:
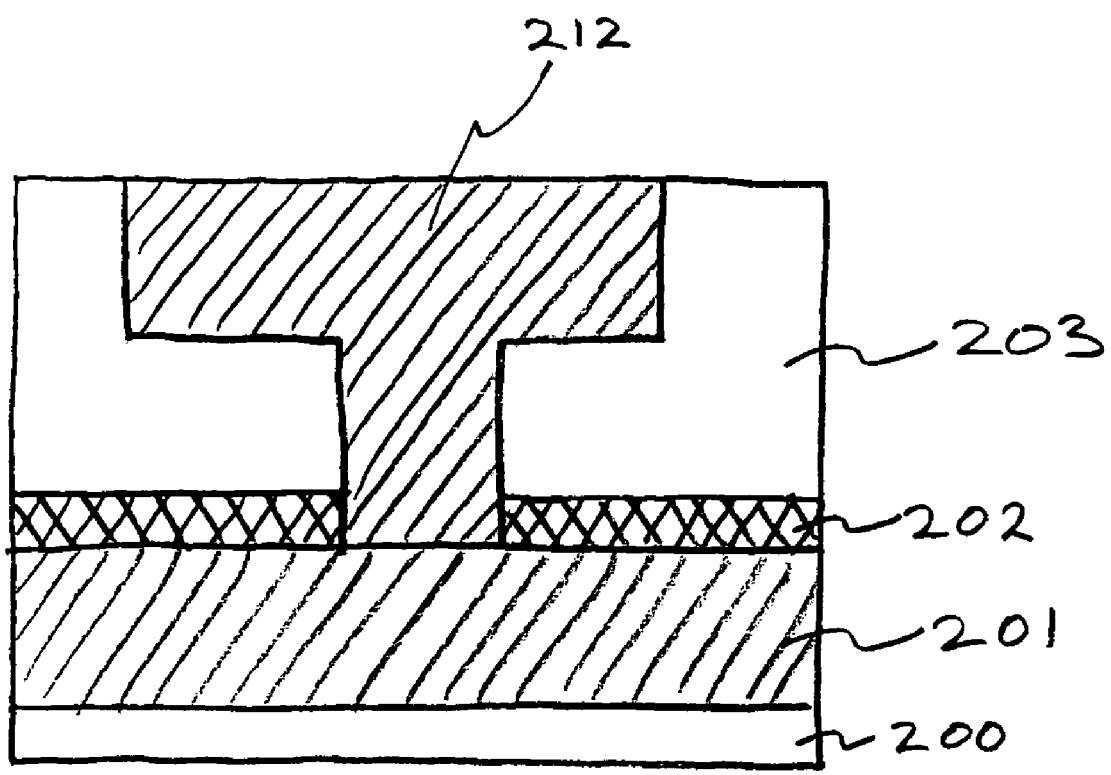

Barrier layer 202 removal may be followed by a short wet etch (that employs an etch chemistry that is compatible with the material used to form conductive layer 201) to clear etch residue from the surface of conductive layer 201. When copper is used to make the conductive layers, that portion of barrier layer 202 should be removed, using a copper compatible chemistry, before any copper electroplating step is applied to fill via 207 and trench 210. Removal of barrier layer 202 produces the structure illustrated in FIG. 2n.

Following that barrier layer removal step, trench 210 and via 207 are filled with second conductive layer 212. Second conductive layer 212 may be copper, and may be formed using a conventional copper electroplating process, in which a copper layer is formed on a barrier layer and a seed layer (not illustrated) used to line trench 210 and via 207. The copper barrier layer may comprise a refractory material, such as titanium nitride and may have a thickness in the approximate range of 100 and 500 angstroms. Suitable seed materials for the deposition of copper include copper and nickel.

As with first conductive layer 201, second conductive layer 212 may be formed from various materials that can serve to conduct electricity within an integrated circuit. When an excess amount of conductive material is used to fill trench 210 above the surface of dielectric layer 203, a chemical mechanical polishing (CMP) process may be applied to remove the excess conductive material and to planarize the surface of the second conductive layer 212. When an electroplating process is used to form the second conductive layer 212 from copper, the CMP process removes both the excess copper and the excess copper barrier layer.

FIG. 2o illustrates the structure that results after filling trench 210 and via 207 with a conductive material, then applying a CMP step to remove excess material from the surface of layer 203 to produce second conductive layer 212. Although the embodiment illustrated in FIG. 2o illustrates only one dielectric layer 203 and two conductive layers 201 and 212, the process described above may be repeated to form additional conductive and insulating layers until the desired integrated circuit is produced.

Several embodiments of the invention have thus been described. However, those of ordinary skill in the art will recognize that the invention is not limited to the embodiments described, but can be practiced with modification and alteration within the scope and spirit of the appended claims that follow.

We claim:

1. A method, comprising:
applying a bottom anti-reflective coating comprising a polymer and a plurality of refractive polymer beads;
applying a photoresist above the anti-reflective coating;
patterning the photoresist;
etching the substrate to form a first opening;
applying a sacrificial anti-reflective coating comprising a spin-on-polymer and a plurality of refractive polymer beads over the substrate and the first opening such that the first opening is filled with the sacrificial anti-reflective coating;
applying a photoresist over the sacrificial anti-reflective coating;
patterning the photoresist;
etching the substrate and the sacrificial anti-reflective material over the first opening to form a second opening; and
filling the first opening and the second opening with a metal.

2. The method of claim 1, wherein the plurality of refractive polymer beads have a core-shell structure comprising an inorganic reflective core and an organic refractive shell.

3. The method of claim 1, wherein the plurality of refractive polymer beads have a core-shell structure comprising an absorbent core and an organic refractive shell.

* * * * *